US012621943B2

(12) United States Patent
Tang et al.

(10) Patent No.: US 12,621,943 B2
(45) Date of Patent: May 5, 2026

(54) ROTARY DIGITAL DISPLAY DEVICE

(71) Applicant: Shenzhen Qishunda Xingye Technology Co., Ltd., Shenzhen (CN)

(72) Inventors: Tiaoping Tang, Shenzhen (CN); Tao Cheng, Shenzhen (CN); Jugen Yang, Shenzhen (CN)

(73) Assignee: Shenzhen Qishunda Xingye Technology Co., Ltd., Shenzhen (CN)

( * ) Notice: Subject to any disclaimer, the term of this patent is extended or adjusted under 35 U.S.C. 154(b) by 106 days.

(21) Appl. No.: 18/898,733

(22) Filed: Sep. 27, 2024

(65) Prior Publication Data

US 2026/0068064 A1      Mar. 5, 2026

Related U.S. Application Data

(63) Continuation of application No. PCT/CN2024/120313, filed on Sep. 23, 2024.

(30) Foreign Application Priority Data

Sep. 5, 2024    (CN) .......................... 202411243830.7

(51) Int. Cl.
H05K 5/02 (2006.01)
H05K 5/00 (2025.01)

(52) U.S. Cl.
CPC ......... H05K 5/0217 (2013.01); H05K 5/0052 (2013.01); H05K 5/0086 (2013.01)

(58) Field of Classification Search
CPC .. H05K 5/0052; H05K 5/0086; H05K 5/0217; G09G 3/005
See application file for complete search history.

(56) References Cited

U.S. PATENT DOCUMENTS

| | | | | |
|---|---|---|---|---|
| 6,215,480 | B1 * | 4/2001 | Danis .................. | G06F 3/03545 |
| | | | | 345/184 |
| 8,854,439 | B2 * | 10/2014 | Ito .......................... | G09G 3/005 |
| | | | | 348/54 |
| 12,457,695 | B2 * | 10/2025 | Im ............................ | G09F 9/33 |
| 2011/0234772 | A1 * | 9/2011 | Ito .......................... | G02B 30/24 |
| | | | | 257/E33.056 |
| 2022/0418116 | A1 * | 12/2022 | Im ............................ | G09F 9/33 |

FOREIGN PATENT DOCUMENTS

WO    WO-2021085733 A1 *  5/2021 ........... H05K 5/0217

OTHER PUBLICATIONS

Machine translation of WO-2021085733-A1. (Year: 2026).*

* cited by examiner

*Primary Examiner* — Michael Pervan

(57)      ABSTRACT

Disclosed is a rotary digital display device, including a main body support, a battery, a flexible circuit board, a light guide rod, membranes, and a projection dome cover. The main body support includes a cylindrical surface, and a first end portion and a second end portion. The battery is arranged in the main body support. The flexible circuit board is affixed around the cylindrical surface and provided with lamp positions. The light guide rod is provided with avoidance holes. The membranes are affixed to the light guide rod. The projection dome cover is configured for projecting and displaying preset content or textures on the membranes. The present disclosure achieves display of the preset content or textures. Further, the main body support is rotatably connected to the terminal in a fitted manner, and the projection dome cover drives the main body support to rotate by 360°.

10 Claims, 8 Drawing Sheets

ROTARY DIGITAL DISPLAY DEVICE

CROSS REFERENCE TO RELATED APPLICATIONS

The present application is a Continuation Application of PCT Application No. PCT/CN2024/120313 filed on Sep. 23, 2024, which claims the benefit of Chinese Patent Application No. 202411243830.7 filed on Sep. 5, 2024. All the above are hereby incorporated by reference in their entirety.

TECHNICAL FIELD

The present disclosure relates to the technical field of digital tubes, and in particular to a rotary digital display device.

BACKGROUND

At present, with the development of science and technology, an increasing number of various terminal products such as electronic cigarette products, electronic toys and the like, are provided with display devices like digital tubes to enhance their functionality. However, most digital tubes in the prior art are conventional static display screens, which have limitations in interaction with users, display less content, and bring little fun to users. In view of this, it is necessary to provide a rotary digital display device to overcome the above defects.

SUMMARY

An objective of the present disclosure is to provide a rotary digital display device, so as to overcome the defects of digital tubes in the prior art including less content display, limitations in interaction with users, and little fun. The device enhances fun, novelty and interactivity of electronic products and fills a current market gap.

In order to achieve the above objective, the present invention provides a rotary digital display device, which can be installed on a terminal, including:

a main body support, where the main body support is hollow and cylindrical, including a cylindrical surface, and a first end portion and a second end portion respectively located at both ends of the cylindrical surface; either of the first end portion and the second end portion is rotatably connected with a preset component of the terminal respectively in a fitted manner;

a battery, where the battery is arranged in the main body support;

a flexible circuit board, where the flexible circuit board is affixed around the cylindrical surface and is electrically connected to the battery; lamp positions configured for displaying preset content or textures are arranged at preset positions of the flexible circuit board;

a light guide rod, where the light guide rod is internally hollow, such that the flexible circuit board can be press-fitted on the cylindrical surface; the light guide rod is further provided with avoidance holes corresponding to the lamp positions;

membranes, where the membranes are affixed to a side of the light guide rod away from the flexible circuit board, and configured for displaying the preset content or textures formed when light emitted from the lamp positions penetrates through the avoidance holes; and a projection dome cover, where the projection dome cover is fixed on the main body support and the membranes are spaced apart from each other in a surrounding manner to project and display the preset content or textures on the membranes.

In a preferred embodiment, the light guide rod includes a first arc-shaped piece and a second arc-shaped piece that are both semi-circular; edges of both sides of the first arc-shaped piece extend outward perpendicularly to form a first connecting piece, and edges both sides of the second arc-shaped piece extend outward perpendicularly to form a second connecting piece; and the first connecting piece is provided with a plurality of snapping columns, and the second connecting piece is provided with snapping holes in one-to-one correspondence with the snapping columns, where the snapping columns are configured for snap-in connection with the corresponding snapping holes to collectively form a cylindrical cavity by enclosing the first arc-shaped piece and the second arc-shaped piece, so as to coat and press-fit the flexible circuit board.

In a preferred embodiment, a plurality of isolation pieces are radially arranged on a surface of a side of the light guide rod away from the flexible circuit board, and the isolation pieces are configured for dividing the surface of the light guide rod into a plurality of areas; a plurality of the membranes are arranged and are in affixed connection with a plurality of areas in one-to-one correspondence respectively; and part of the isolation pieces can be reused with the first connecting piece and the second connecting piece.

In a preferred embodiment, the cylindrical surface is provided with a first positioning pin and a second positioning pin arranged in a radial direction; and the flexible circuit board is internally provided with a limiting hole that is in fit with the first positioning pin, semi-circular positioning grooves are formed along edges of both sides of the flexible circuit board in an unfolded state, and the positioning grooves are arranged in pairs around a circumferential side of the second positioning pin.

In a preferred embodiment, the first arc-shaped piece is provided with a first positioning hole that is in fitted connection with the second positioning pin, and the second arc-shaped piece is provided with a second positioning hole that is in fitted connection with the first positioning pin.

In a preferred embodiment, the first end portion is provided with a limiting bracket, and the limiting bracket is configured for limiting an action of the battery extending from the first end portion.

In a preferred embodiment, a circle of first limiting grooves are formed along edges of the first end portion, and a circle of second limiting grooves are formed along edges of the second end portion; and the first limiting grooves and the second limiting grooves are configured for fitted connection with the preset components of the terminal respectively to achieve damped limiting over a rotation angle of the main body support.

In a preferred embodiment, one side of the flexible circuit board close to the first end portion is provided with an annular first electrode conductive contact sheet and an annular data port conductive contact sheet in a circumferential direction; the first electrode conductive contact sheet and the data port conductive contact sheet are spaced apart from each other and electrically connected to one electrode of the battery; one side of the flexible circuit board close to the second end portion is provided with an annular second electrode conductive contact sheet and an annular positive/negative rotation detection conductive contact sheet in a circumferential direction; and the second electrode conductive contact sheet and the positive/negative rotation detection conductive contact sheet are spaced apart from each other and electrically connected to the other electrode of the battery.

In a preferred embodiment, a first terminal is formed at a preset position of the flexible circuit board close to the first end portion in a way of extending axially, the first end portion is provided with a first accommodating groove for the first terminal to extend into, and the first terminal is electrically connected to a positive electrode or a negative electrode of the battery; and a second terminal is formed at a preset position of the flexible circuit board close to the second end portion in a way of extending axially, the second end portion is provided with a second accommodating groove for the second terminal to extend into, and the second terminal is electrically connected to the negative electrode or the positive electrode of the battery.

In a preferred embodiment, the projection dome cover includes a first half dome cover and a second half dome cover that are snap-fitted; a semi-circular first avoidance groove is formed in a portion of the first half dome cover close to either end of the main body support, and a semi-circular second avoidance groove is formed in a portion of the second half dome cover close to either end of the main body support, where either of the first avoidance grooves and the corresponding second avoidance groove are collectively fitted around the cylindrical surface of the main body support, such that the first electrode conductive contact sheet, the data port conductive contact sheet, the second electrode conductive contact sheet, and the positive/negative rotation detection conductive contact sheet are all located outside the projection dome cover.

In the rotary digital display device provided by the present disclosure, the flexible circuit board is press-fitted around the cylindrical surface of the main body support through the light guide rod, such that when the lamp positions in the flexible circuit board emit light, the light can penetrate through the avoidance holes of the light guide rod and then be displayed on the membranes and ultimately projected onto the projection dome cover, so as to achieve display of the preset content or textures. Further, the main body support is rotatably connected to the terminal in a fitted manner, and the projection dome cover drives the main body support to rotate by 360°, which enables to achieve the display of various content and a function of interface switching, facilitates close interaction between a user and an electronic product, enhances the fun, novelty and interactivity of the electronic product, and fills a current market gap.

BRIEF DESCRIPTION OF THE DRAWINGS

To describe the technical solution in the examples of the present disclosure more clearly, the accompanying drawings required for describing the examples are briefly described below. It should be understood that the following accompanying drawings show merely some examples of the present disclosure, and therefore it should not be construed as a limitation to the scope. Those of ordinary skill in the art can also derive other accompanying drawings from these accompanying drawings without making inventive efforts.

Figure 1:
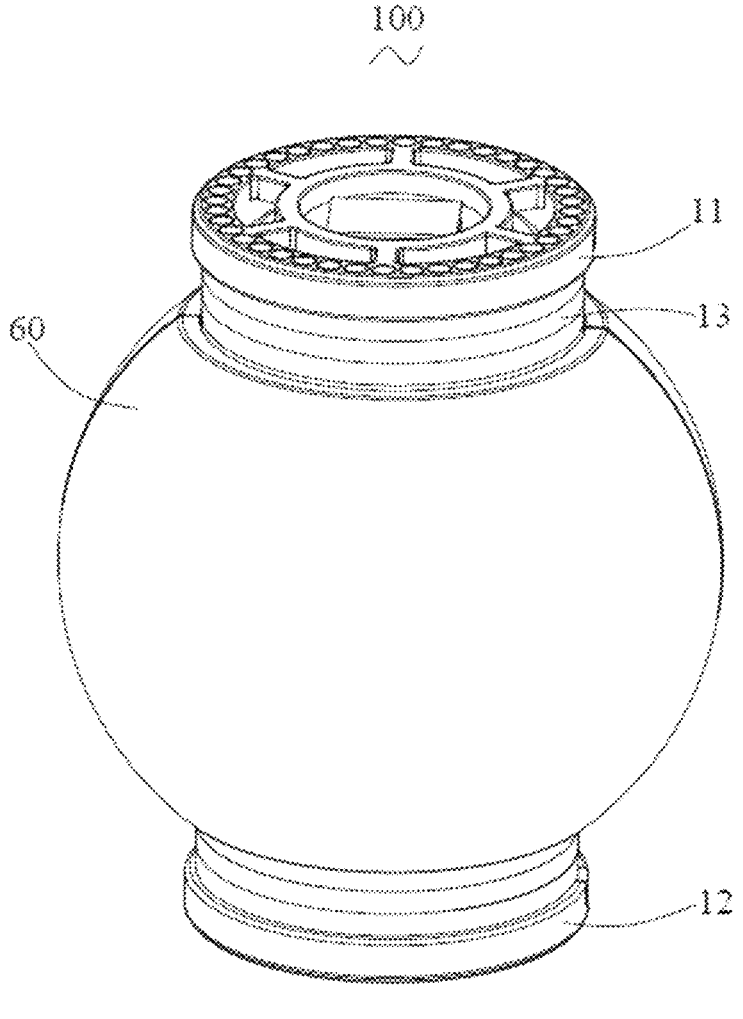
FIG. 1 is a space diagram of a rotary digital display device provided by the present disclosure.
Figure 2:
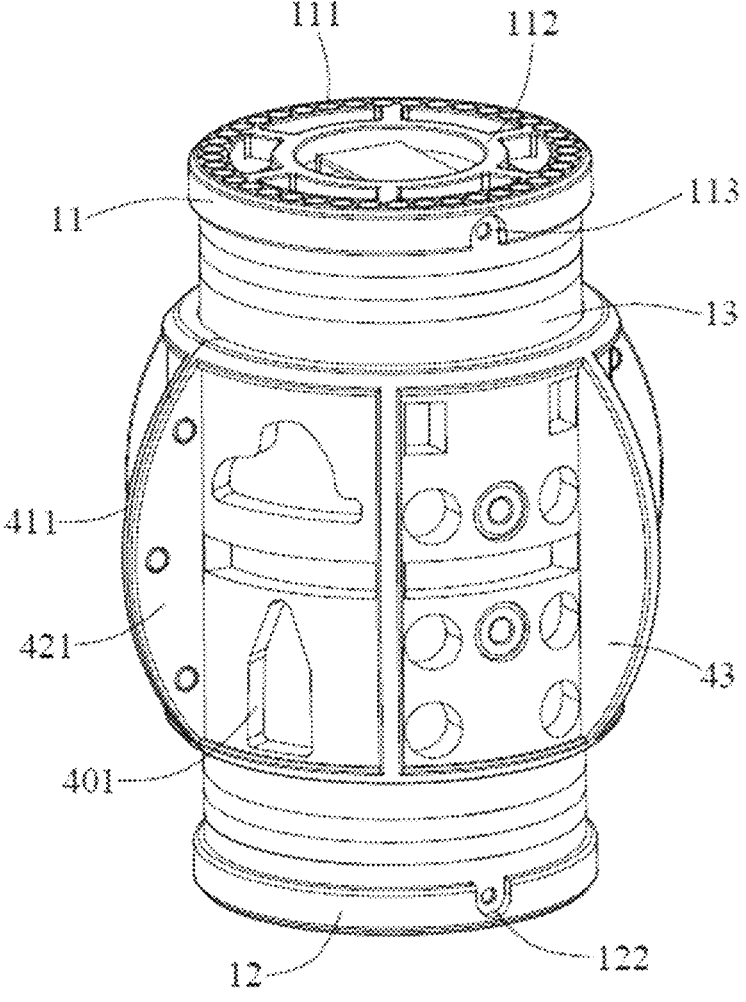
FIG. 2 is a space diagram of the rotary digital display device with a hidden projection dome cover shown in FIG. 1.
Figure 3:
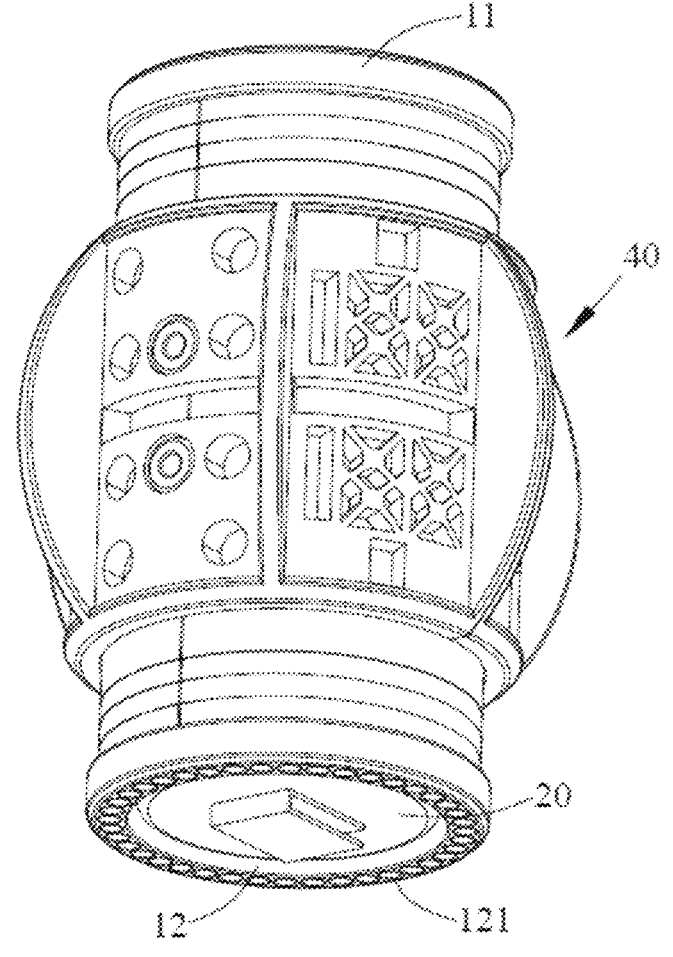
FIG. 3 is a space diagram of another view of the rotary digital display device with the hidden projection dome cover shown in FIG. 2.
Figure 4:
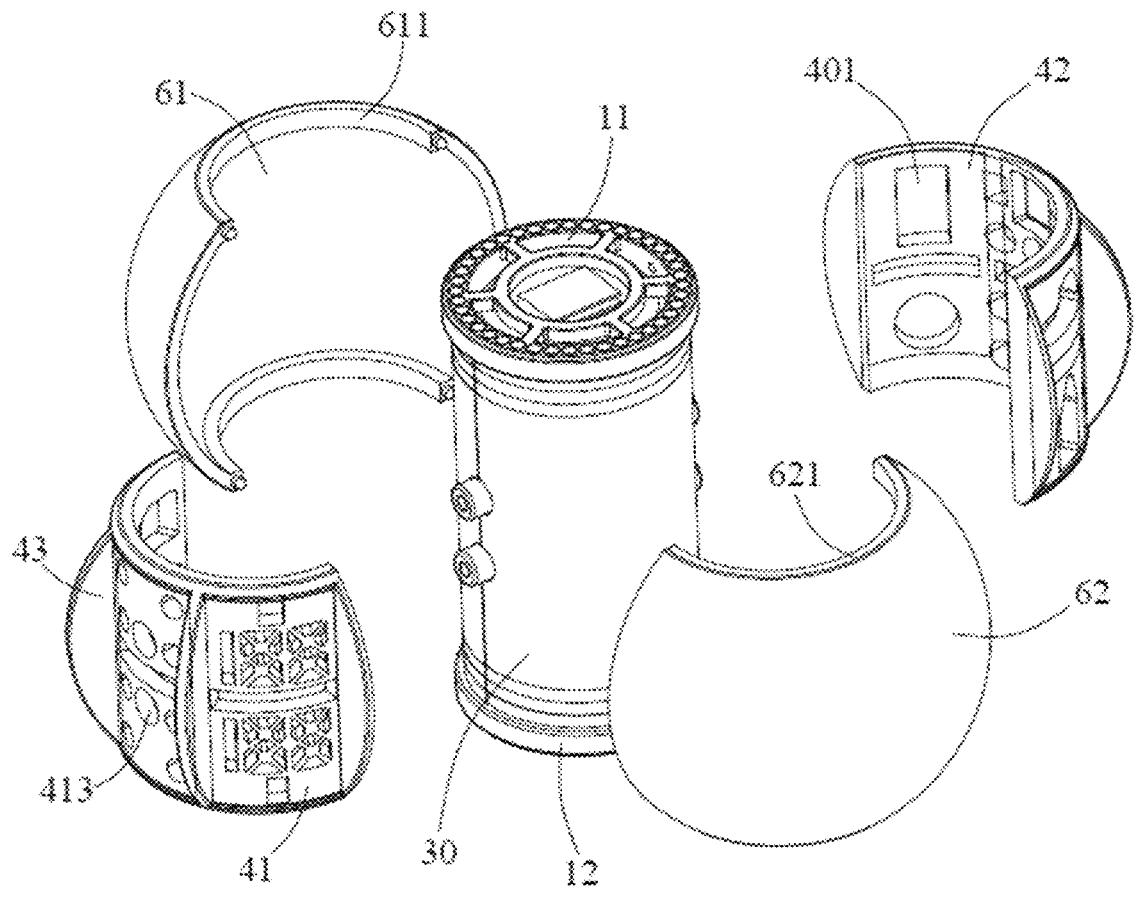
FIG. 4 is a three-dimensional exploded view of the rotary digital display device shown in FIG. 1.
Figure 5:
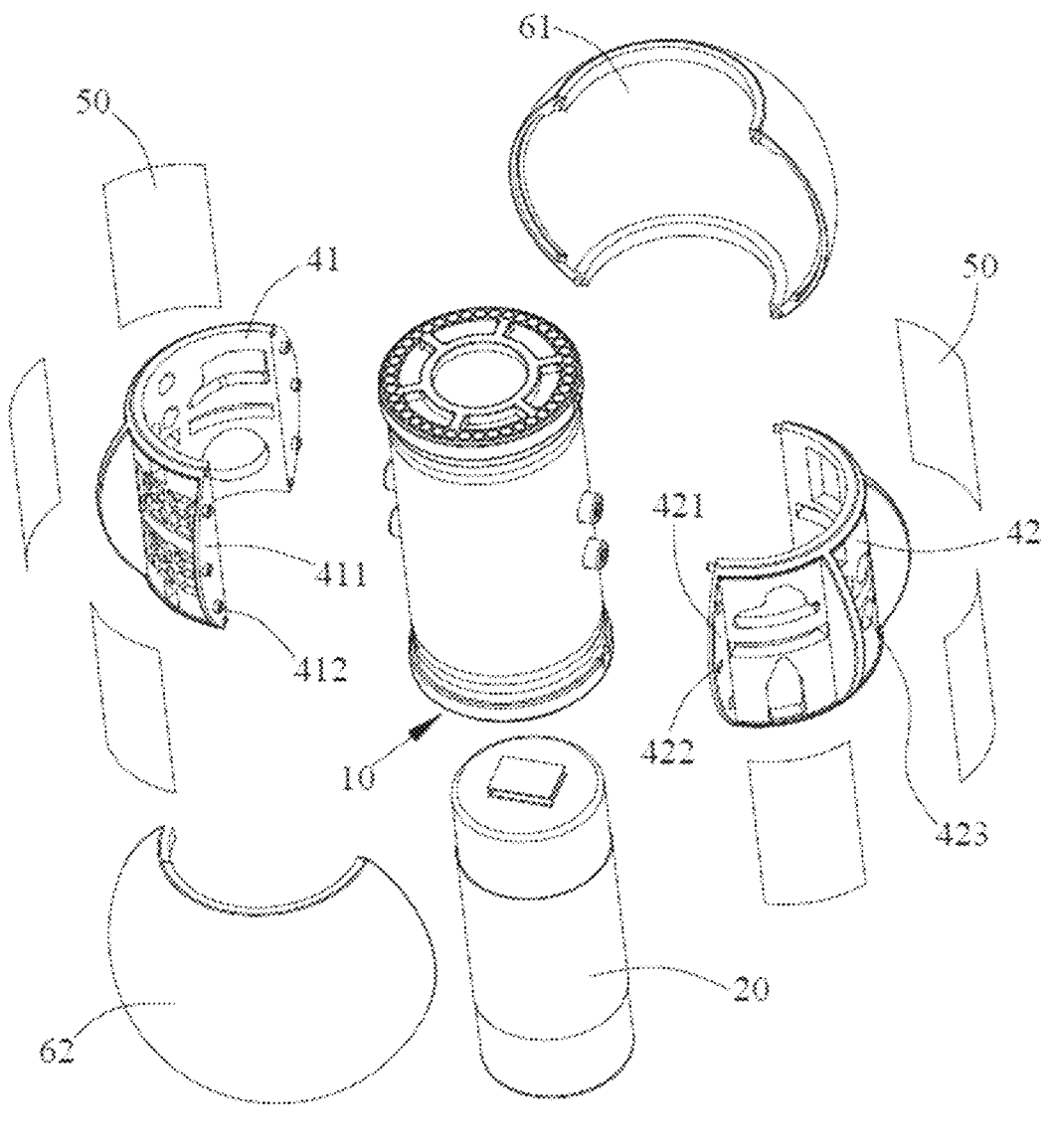
FIG. 5 is a further three-dimensional exploded view of the rotary digital display device shown in FIG. 4.

Reference numerals in the drawings: 100. rotary digital display device;

10. main body support; 11. first end portion; 111. first limiting groove; 112. limiting bracket; 113. first accommodating groove; 12. second end portion; 121. second limiting groove; 122. second accommodating groove; 13. cylindrical surface; 131. first positioning pin; 132. second positioning pin;

20. battery; 30. flexible circuit board; 301. limiting hole; 302. positioning groove; 31. lamp position; 32. first electrode conductive contact sheet; 33. data port conductive contact sheet; 34. second electrode conductive contact sheet; 35. positive/negative rotation detection conductive contact sheet; 36. first terminal; 37. second terminal;

40. light guide rod; 401. avoidance hole; 41. first arc-shaped piece; 411. first connecting piece; 412. snapping column; 413. first positioning hole; 42. second arc-shaped piece; 421. second connecting piece; 422. snapping hole; 423. second positioning hole; 43. isolation piece;

50. membrane; 60. projection dome cover; 61. first half dome cover; 611. first avoidance groove; 62. second half dome cover; and 621. second avoidance groove.

DETAILED DESCRIPTIONS OF THE EMBODIMENTS

To make objectives, technical solutions and beneficial technical effects of the present disclosure clearer, the present disclosure will be further described in detail with reference to accompanying drawings and specific embodiments. It should be understood that the specific embodiments described in the present specification are merely illustrative of the present disclosure and are not intended to limit the present disclosure.

It should also be understood that the terms used in the present specification are merely for the purpose of describing specific examples and are not intended to limit the present disclosure. As used in the present specification and the appended claims, the singular terms "a", "an" and "the" are intended to include the plural forms unless clearly indicated otherwise in the context.

It should be further understood that the term "and/or" as used in the present specification and the appended claims refers to and includes any or all possible combinations of one or more of the associated listed items.

In an example of the present disclosure, a rotary digital display device 100 is provided. The device can be installed on a terminal such as an electronic cigarette product and an electronic product to display preset content (e.g., time, numbers, and the like) or textures (e.g., a weather symbol, a setting status, and the like) externally, and is capable of switching a display interface. Further, the device facilitates rotation by a user when holding an electronic product, which relieves stress and enhances fun and interactivity of the product.

As illustrated in FIGS. 1-5, the rotary digital display device 100 includes: a main body support 10, a battery 20, a flexible circuit board 30, a light guide rod 40, membranes 50, and a projection dome cover 60.

In this example, the main body support 10 is hollow and cylindrical, including a cylindrical surface 13, and a first end portion 11 and a second end portion 12 respectively located at both ends of the cylindrical surface 13. The first end portion 11 and the second end portion 12 may both be annular and have a radius slightly larger than a radius of a circle enclosed by the cylindrical surface 13. Either of the first end portion 11 and the second end portion 12 is rotatably connected with a preset component of a terminal respectively in a fitted manner. For example, the terminal is provided with a fixed groove for placing the entire rotary digital display device 100, either of upper and lower sides of the fixed groove is provided with a groove structure respectively for the first end portion 11 and the second end portion 12 to rotatably extend into in a fitted manner, and the first end portion 11 and the second end portion 12 are respectively snapped into the two groove structures without affecting their own rotation.

Further, a circle of first limiting grooves 111 are formed along edges of the first end portion 11, and a circle of second limiting grooves 121 are formed along edges of the second end portion 12. The first limiting grooves 111 and the second limiting grooves 121 are configured for fitted connection with the preset components of the terminal respectively to achieve damped limiting over a rotation angle of the main body support 10. In combination with the example above, a hemispherical protrusion that matches the first limiting grooves 111 or the second limiting grooves 121 in shape is arranged on either of the upper and lower sides of the fixed groove, and when the hemispherical protrusion snaps into one of the first limiting grooves 111 or the second limiting grooves 121, the main body support 10 will be prevented from further rotating under the action of a certain force, which provides rotation feedback to a user when rotating the entire device.

Figure 8:
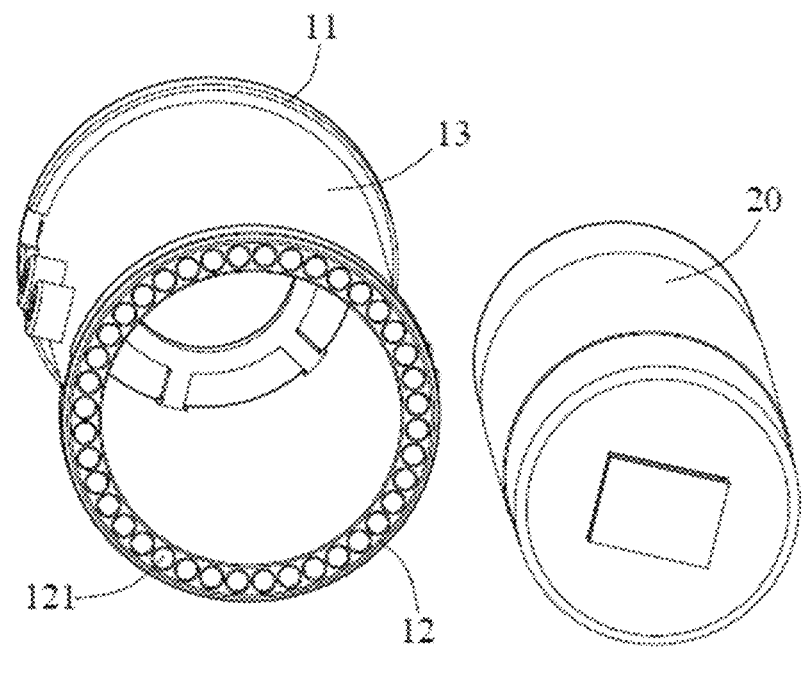
FIG. 8 is a three-dimensional exploded view of a main body support and a battery.
Figure 9:
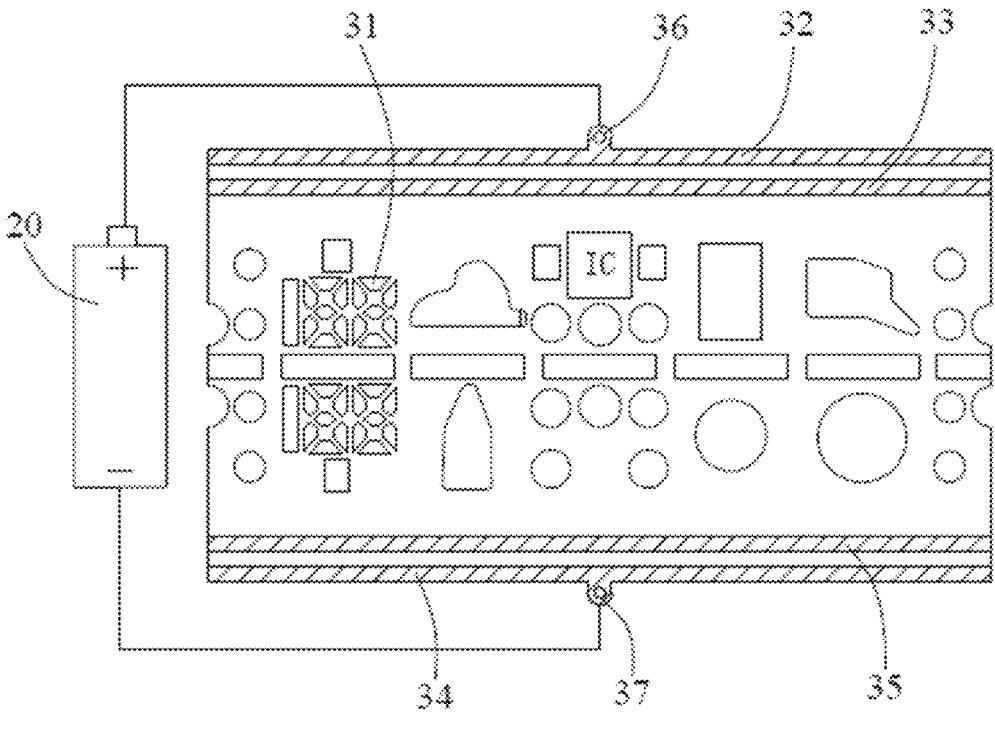
FIG. 9 is a schematic view of a flexible circuit board fully unfolded and connected to a battery.
Figure 10:
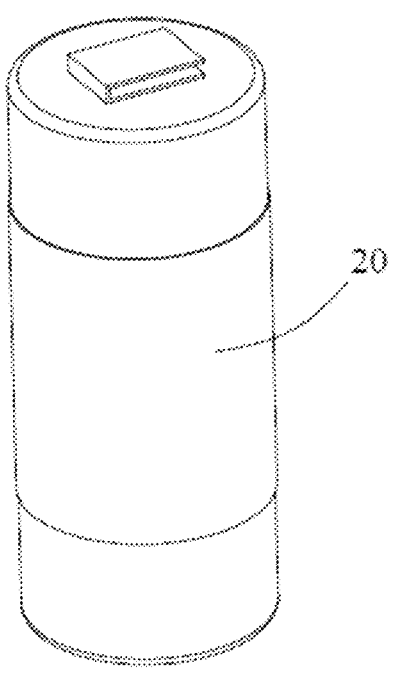
FIG. 10 is a space diagram of a battery.

In an example of the present disclosure, with reference to FIGS. 8-10, the battery 20 is a cylindrical battery and is arranged in the main body support 10. Further, the first end portion 11 is provided with a limiting bracket 112, and the limiting bracket 112 is located between the circle of first limiting grooves 111 to limit an action of the battery 20 extending from the first end portion 11, that is, the battery 20 can be inserted into the main body support 10 from the second end portion 12 but cannot extend from the first end portion 11.

Figure 6:
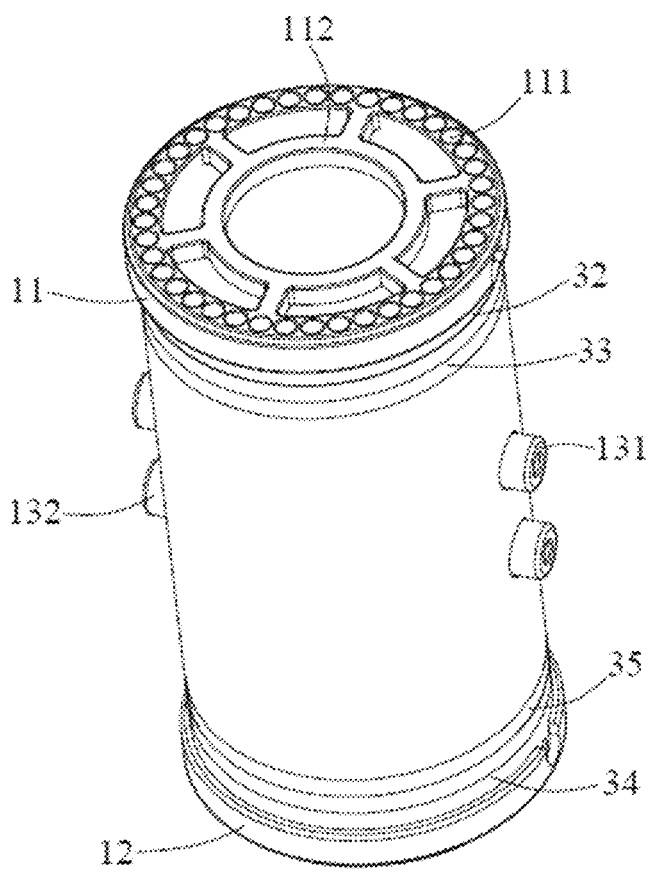
FIG. 6 is a schematic view of a flexible circuit board arranged around a main body support.
Figure 7:
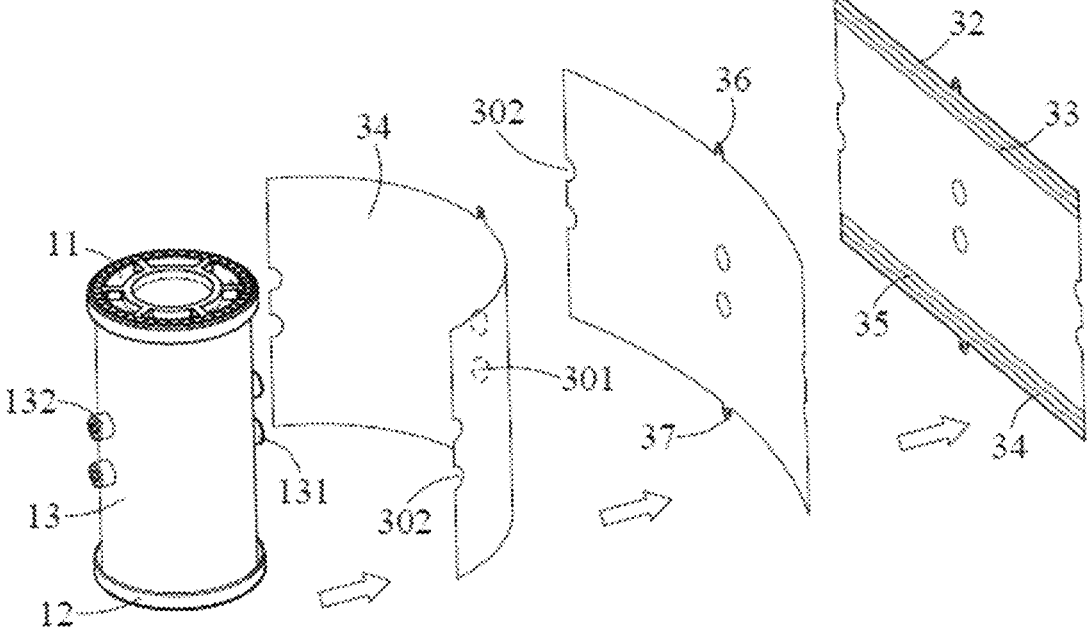
FIG. 7 is a schematic view of a flexible circuit board gradually unfolded on a main body support.

In an example of the present disclosure, with reference to FIGS. 6, 7 and 9, the flexible circuit board 30 (FPC) is affixed around the cylindrical surface 13 and is electrically connected to the battery 20. The flexible circuit board 30 contains various circuits, and lamp positions 31 configured for displaying preset content or textures are arranged at preset positions. That is, the flexible circuit board 30 is provided with an IC and other processors, as well as the preset content (e.g., time, numbers, and the like) or the textures (e.g., a weather symbol, a setting status, and the like). The lamp positions 31 of the flexible circuit board 30 are capable of displaying different content or textures according to different instructions.

Specifically, one side of the flexible circuit board 30 close to the first end portion 11 is provided with an annular first electrode conductive contact sheet 32 and an annular data port conductive contact sheet 33 in a circumferential direction. The first electrode conductive contact sheet 32 and the data port conductive contact sheet 33 are spaced apart from each other and electrically connected to one electrode (e.g., one positive electrode) of the battery 20. The data port conductive contact sheet 33 is configured for electrically connecting with a charging/communication interface of a terminal to facilitate data transmission with an external terminal. One side of the flexible circuit board 30 close to the second end portion 12 is provided with an annular second electrode conductive contact sheet 34 and an annular positive/negative rotation detection conductive contact sheet 35 in a circumferential direction. The second electrode conductive contact sheet 34 and the positive/negative rotation detection conductive contact sheet 35 are spaced apart from each other and electrically connected to the other electrode (e.g., one negative electrode) of the battery 20. The positive/negative rotation detection conductive contact sheet 35 is configured for detecting whether a current rotation of the main body support 10 is positive or negative. For its implementation principle and specific circuit structure, reference can be made to the prior art, so details are not described in detail herein.

It should be noted that the first electrode conductive contact sheet 32 and the second electrode conductive contact sheet 34 are respectively electrically connected to the positive electrode and the negative electrode of the battery 20 by means of jump wire welding, to supply power to the entire flexible circuit board 30. The data port conductive contact sheet 33 and the positive/negative rotation detection conductive contact sheet 35 are located next to inner sides of the first electrode conductive contact sheet and the second electrode conductive contact sheet respectively, and are electrically connected to a processor of the flexible circuit board 30. Further, all the above four conductive contact sheets can be made of copper, and when the flexible circuit board 30 is wound around the cylindrical surface 13, the four conductive contact sheets simultaneously form a ring, such that no matter how the main body support 10 rotates, an electrical connection with the battery 20 or realization of corresponding functions will not be affected. Alternatively, the battery 20 can also be electrically connected to power-demanding components of the terminal through the first electrode conductive contact sheet 32 and the second electrode conductive contact sheet 34 to supply power to the power-demanding components.

Further, the cylindrical surface 13 is provided with a first positioning pin 131 and a second positioning pin 132 arranged in a radial direction. The flexible circuit board 30 is internally provided with a limiting hole 301 that is in fit with the first positioning pin 131, semi-circular positioning grooves 302 are formed along edges of both sides of the flexible circuit board 30 in an unfolded state, and the positioning grooves 302 are arranged in pairs around a circumferential side of the second positioning pin 132, thereby positioning the flexible circuit board 30 during assembly around the cylindrical surface 13, enhancing assembly precision, and preventing the wound flexible circuit board 30 from sliding relative to the cylindrical surface 13.

Further, a first terminal 36 is formed at a preset position of the flexible circuit board 30 close to the first end portion 11 in a way of extending axially, the first end portion 11 is provided with a first accommodating groove 113 for the first terminal 36 to extend into, and the first terminal 36 is electrically connected to the positive electrode or the negative electrode of the battery 20; a second terminal 37 is formed at a preset position of the flexible circuit board 30 close to the second end portion 12 in a way of extending axially, the second end portion 12 is provided with a second accommodating groove 122 for the second terminal 37 to extend into, and the second terminal 37 is electrically connected to the negative electrode or the positive electrode of the battery 20.

In an example of the present disclosure, the light guide rod 40 is internally hollow and provided with a cylindrical cavity with upper and lower openings, and a shape of the cylindrical cavity is slightly larger than that of the flexible circuit board 30 in a wound state, such that the flexible circuit board 30 can be press-fitted on the cylindrical surface 13. The light guide rod 40 is further provided with avoidance holes 401 corresponding to the lamp positions 31, and a shape of each of the avoidance holes 401 is consistent with an arrangement shape of each of the lamp positions 31, such that light reflection can be achieved.

Specifically, the light guide rod 40 includes a first arc-shaped piece 41 and a second arc-shaped piece 42 that are both semi-circular. Edges of both sides of the first arc-shaped piece 41 extend outward perpendicularly to form a first connecting piece 411, and edges both sides of the second arc-shaped piece 42 extend outward perpendicularly to form a second connecting piece 421. The first connecting piece 411 is provided with a plurality of snapping columns 412, and the second connecting piece 421 is provided with snapping holes 422 in one-to-one correspondence with the snapping columns 412, where the snapping columns 412 are configured for snap-in connection with the corresponding snapping holes 422 to collectively form a cylindrical cavity by enclosing the first arc-shaped piece 41 and the second arc-shaped piece 42, so as to coat and press-fit the flexible circuit board 30.

The first arc-shaped piece 41 is provided with a first positioning hole 413 that is in fitted connection with the second positioning pin 132, and the second arc-shaped piece 42 is provided with a second positioning hole 423 that is in fitted connection with the first positioning pin 131, such that the light guide rod 40 can be precisely positioned on the main body support 10, and the avoidance holes 401 can be aligned with the lamp positions 31 on the wound flexible circuit board 30 during assembly.

Further, a plurality of isolation pieces 43 are radially arranged on a surface of a side of the light guide rod 40 away from the flexible circuit board 30, and the isolation pieces 43 are configured for dividing the surface of the light guide rod 40 into a plurality of areas and forming a plurality of display interfaces, so as to show different types of content or textures. Part of the isolation pieces 43 can be reused with the first connecting piece 411 and the second connecting piece 421.

In an example, the membranes 50 are affixed to a side of the light guide rod 40 away from the flexible circuit board 30, and configured for displaying the preset content or textures formed when light emitted from the lamp positions 31 penetrates through the avoidance holes 401 and forming a content display area. When the light guide rod 40 is provided with the isolation pieces 43, a plurality of the membranes 50 are arranged and are in affixed connection with a plurality of areas on the light guide rod 40 in one-to-one correspondence respectively.

In this example, the projection dome cover 60 is fixed on the main body support 10 and the membranes 50 are spaced apart from each other in a surrounding manner to project and display the preset content or textures on the membranes 50, such that displayed content can be enlarged, and a user can rotate and relieve stress easily.

Specifically, the projection dome cover 60 includes a first half dome cover 61 and a second half dome cover 62 that are snap-fitted. A semi-circular first avoidance groove 611 is formed in a portion of the first half dome cover 61 close to either end of the main body support 10, and a semi-circular second avoidance groove 621 is formed in a portion of the second half dome cover 62 close to either end of the main body support 10, where either of the first avoidance grooves 611 and the corresponding second avoidance groove 621 on a same side collectively form a circle and are fitted around the cylindrical surface 13 of the main body support 10, such that the first electrode conductive contact sheet 32, the data port conductive contact sheet 33, the second electrode conductive contact sheet 34, and the positive/negative rotation detection conductive contact sheet 35 are all located outside the projection dome cover 60, thereby preventing any impact on electrical connections of these conductive contact sheets.

To sum up, in the rotary digital display device 100 provided by the present disclosure, the flexible circuit board 30 is press-fitted around the cylindrical surface 13 of the main body support 10 through the light guide rod 40, such that when the lamp positions 31 in the flexible circuit board 30 emit light, the light can penetrate through the avoidance holes 401 of the light guide rod 40 and then be displayed on the membranes 50 and ultimately projected onto the projection dome cover 60, so as to achieve display of the preset content or textures. Further, the main body support 10 is rotatably connected to the terminal in a fitted manner, and the projection dome cover 60 drives the main body support 10 to rotate by 360°, which enables to achieve the display of various content and a function of interface switching, facilitates close interaction between a user and an electronic product, enhances the fun, novelty and interactivity of the electronic product, and fills a current market gap.

The present disclosure is not limited merely to what is described in the specification and the embodiments, such that additional advantages and modifications can be readily achieved by those skilled in the art. Without departing from the spirit and scope of the general concept as defined by the claims and the equivalents, the present disclosure is not limited to the specific details, representative apparatus, and illustrative examples as shown and described herein.

What is claimed is:

1. A rotary digital display device, which can be installed on a terminal, comprising:

a main body support, wherein the main body support is hollow and cylindrical, comprising a cylindrical surface, and a first end portion and a second end portion respectively located at both ends of the cylindrical surface; either of the first end portion and the second end portion is rotatably connected with a preset component of the terminal respectively in a fitted manner;

a battery, wherein the battery is arranged in the main body support;

a flexible circuit board, wherein the flexible circuit board is affixed around the cylindrical surface and is electrically connected to the battery; lamp positions configured for displaying preset content or textures are arranged at preset positions of the flexible circuit board;

a light guide rod, wherein the light guide rod is internally hollow, such that the flexible circuit board can be press-fitted on the cylindrical surface; the light guide rod is further provided with avoidance holes corresponding to the lamp positions;

membranes, wherein the membranes are affixed to a side of the light guide rod away from the flexible circuit board, and configured for displaying the preset content or textures formed when light emitted from the lamp positions penetrates through the avoidance holes; and a projection dome cover, wherein the projection dome cover is fixed on the main body support and the membranes are spaced apart from each other in a surrounding manner to project and display the preset content or textures on the membranes.

2. The rotary digital display device according to claim 1, wherein the light guide rod comprises a first arc-shaped piece and a second arc-shaped piece that are both semi-circular; edges of both sides of the first arc-shaped piece extend outward perpendicularly to form a first connecting piece, and edges both sides of the second arc-shaped piece extend outward perpendicularly to form a second connecting piece; and the first connecting piece is provided with a plurality of snapping columns, and the second connecting piece is provided with snapping holes in one-to-one correspondence with the snapping columns, wherein the snapping columns are configured for snap-in connection with the corresponding snapping holes to collectively form a cylindrical cavity by enclosing the first arc-shaped piece and the second arc-shaped piece, so as to coat and press-fit the flexible circuit board.

3. The rotary digital display device according to claim 2, wherein a plurality of isolation pieces are radially arranged on a surface of a side of the light guide rod away from the flexible circuit board, and the isolation pieces are configured for dividing the surface of the light guide rod into a plurality of areas; a plurality of the membranes are arranged and are in affixed connection with a plurality of areas in one-to-one correspondence respectively; and part of the isolation pieces can be reused with the first connecting piece and the second connecting piece.

4. The rotary digital display device according to claim 2, wherein the cylindrical surface is provided with a first positioning pin and a second positioning pin arranged in a radial direction; and the flexible circuit board is internally provided with a limiting hole that is in fit with the first positioning pin, semi-circular positioning grooves are formed along edges of both sides of the flexible circuit board in an unfolded state, and the positioning grooves are arranged in pairs around a circumferential side of the second positioning pin.

5. The rotary digital display device according to claim 4, wherein the first arc-shaped piece is provided with a first positioning hole that is in fitted connection with the second positioning pin, and the second arc-shaped piece is provided with a second positioning hole that is in fitted connection with the first positioning pin.

6. The rotary digital display device according to claim 1, wherein the first end portion is provided with a limiting bracket, and the limiting bracket is configured for limiting an action of the battery extending from the first end portion.

7. The rotary digital display device according to claim 1, wherein a circle of first limiting grooves are formed along edges of the first end portion, and a circle of second limiting grooves are formed along edges of the second end portion; and the first limiting grooves and the second limiting grooves are configured for fitted connection with the preset components of the terminal respectively to achieve damped limiting over a rotation angle of the main body support.

8. The rotary digital display device according to claim 1, wherein one side of the flexible circuit board close to the first end portion is provided with an annular first electrode conductive contact sheet and an annular data port conductive contact sheet in a circumferential direction; the first electrode conductive contact sheet and the data port conductive contact sheet are spaced apart from each other and electrically connected to one electrode of the battery; one side of the flexible circuit board close to the second end portion is provided with an annular second electrode conductive contact sheet and an annular positive/negative rotation detection conductive contact sheet in a circumferential direction; and the second electrode conductive contact sheet and the positive/negative rotation detection conductive contact sheet are spaced apart from each other and electrically connected to the other electrode of the battery.

9. The rotary digital display device according to claim 8, wherein a first terminal is formed at a preset position of the flexible circuit board close to the first end portion in a way of extending axially, the first end portion is provided with a first accommodating groove for the first terminal to extend into, and the first terminal is electrically connected to a positive electrode or a negative electrode of the battery; and a second terminal is formed at a preset position of the flexible circuit board close to the second end portion in a way of extending axially, the second end portion is provided with a second accommodating groove for the second terminal to extend into, and the second terminal is electrically connected to the negative electrode or the positive electrode of the battery.

10. The rotary digital display device according to claim 8, wherein the projection dome cover comprises a first half dome cover and a second half dome cover that are snap-fitted; a semi-circular first avoidance groove is formed in a portion of the first half dome cover close to either end of the main body support, and a semi-circular second avoidance groove is formed in a portion of the second half dome cover close to either end of the main body support, wherein either of the first avoidance grooves and the corresponding second avoidance groove are collectively fitted around the cylindrical surface of the main body support, such that the first electrode conductive contact sheet, the data port conductive contact sheet, the second electrode conductive contact sheet, and the positive/negative rotation detection conductive contact sheet are all located outside the projection dome cover.

* * * * *